United States Patent [19]

Sanwo et al.

[11] Patent Number: 5,530,623
[45] Date of Patent: Jun. 25, 1996

[54] HIGH SPEED MEMORY PACKAGING SCHEME

[75] Inventors: Ikuo J. Sanwo, San Marcos; Michael A. Hoffman, San Diego; Hyung S. Kim, Temecula, all of Calif.

[73] Assignee: NCR Corporation, Dayton, Ohio

[21] Appl. No.: 154,577

[22] Filed: Nov. 19, 1993

[51] Int. Cl.⁶ ............................. H01R 9/09; H01R 23/70; H01R 29/00
[52] U.S. Cl. ..................... 361/788; 361/784; 361/785; 361/791; 361/803; 439/61; 439/489; 439/490; 439/49
[58] Field of Search ..................... 361/784, 785, 361/786, 788, 791, 796, 797, 803; 439/61, 489, 490, 49, 93; 364/708.1; 395/800

[56] References Cited

U.S. PATENT DOCUMENTS

| | | | |
|---|---|---|---|
| 3,191,095 | 6/1965 | Hefti | 439/489 |
| 3,992,686 | 11/1976 | Canning | 333/84 M |
| 4,401,358 | 8/1983 | Daigaku | 439/61 |
| 4,418,971 | 12/1983 | Liss | 439/489 |
| 4,420,793 | 12/1983 | Strandberg | 361/785 |
| 4,468,612 | 8/1984 | Starr | 439/489 |
| 4,575,780 | 3/1986 | Brombal et al. | 361/786 |
| 4,658,333 | 4/1987 | Grimes | 361/788 |
| 4,675,769 | 6/1987 | Marshall et al. | 361/796 |
| 4,984,064 | 1/1991 | Toshio et al. | 361/786 |
| 5,103,247 | 4/1992 | Sugano et al. | 361/786 |
| 5,105,340 | 4/1992 | Lawrence | 361/799 |
| 5,117,331 | 5/1992 | Gebara | 361/775 |
| 5,162,979 | 11/1992 | Anzelone et al. | 361/756 |
| 5,203,004 | 4/1993 | Bunton et al. | 439/93 |

FOREIGN PATENT DOCUMENTS

| 1-183198 | 7/1989 | Japan | 361/796 |
|---|---|---|---|

*Primary Examiner*—Donald A. Sparks
*Attorney, Agent, or Firm*—James M. Stover

[57] ABSTRACT

A memory packaging scheme for high speed computer systems includes, several memory module sockets mounted to a printed circuit board and interconnected by a common set of address, data and control transmission lines within the printed circuit board. The transmission lines are interrupted at each connector. Cooperating memory modules, such as SIMM memory modules are installed in sequence into one or more of the module sockets in accordance with the requirements of the computer system. Installation of a memory module into a memory socket closes the open circuits for each one of the transmission lines at the memory socket, extending the uninterrupted length of the transmission lines to the next memory socket in the sequence. The memory socket and cooperating memory module design thus provides for sizing of the memory board transmission line lengths to accommodate the number of memory modules installed into memory board sockets, thereby eliminating undesirable transmission line effects from occurring within the printed circuit board transmission lines connecting the memory modules.

11 Claims, 3 Drawing Sheets

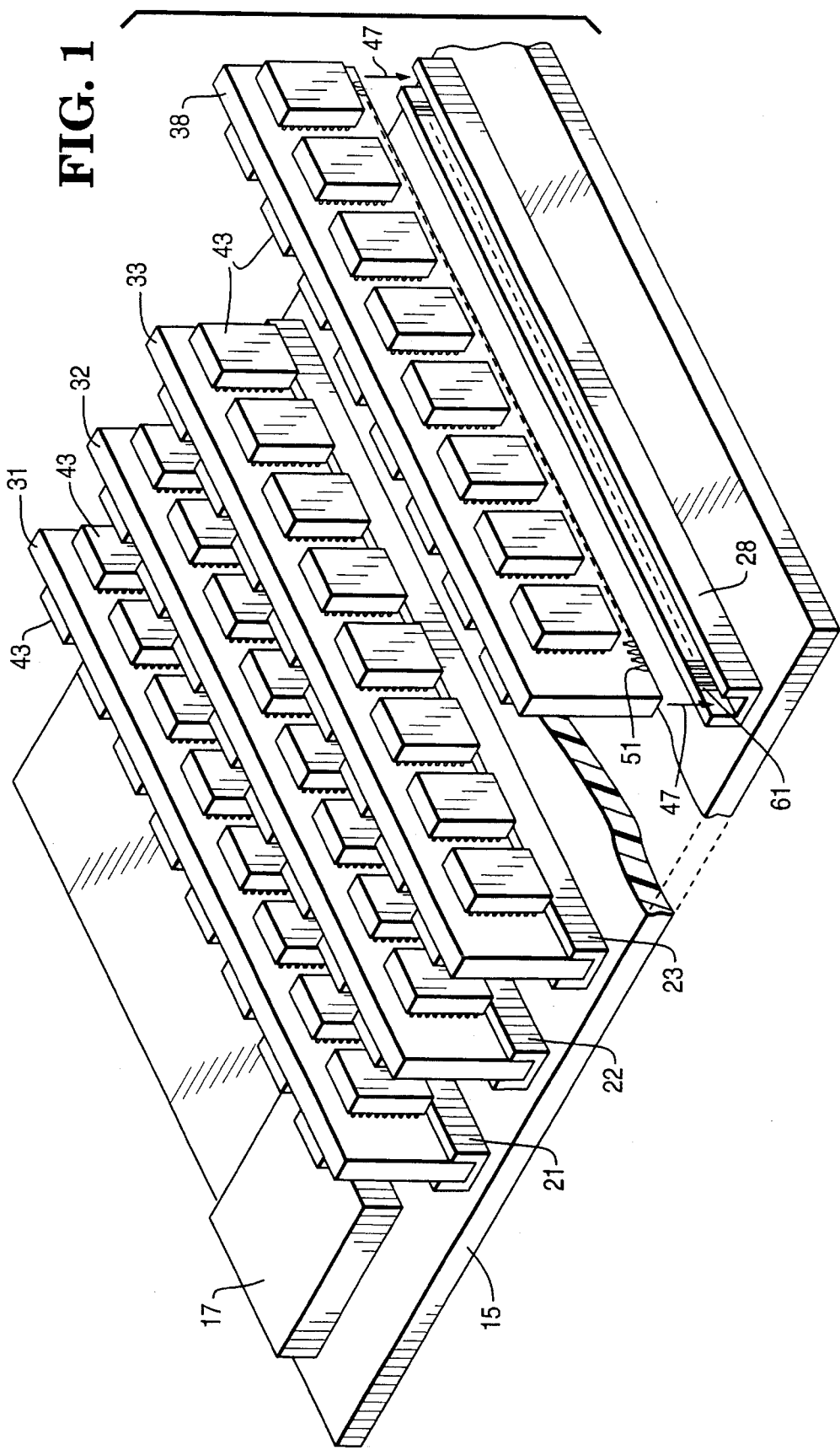

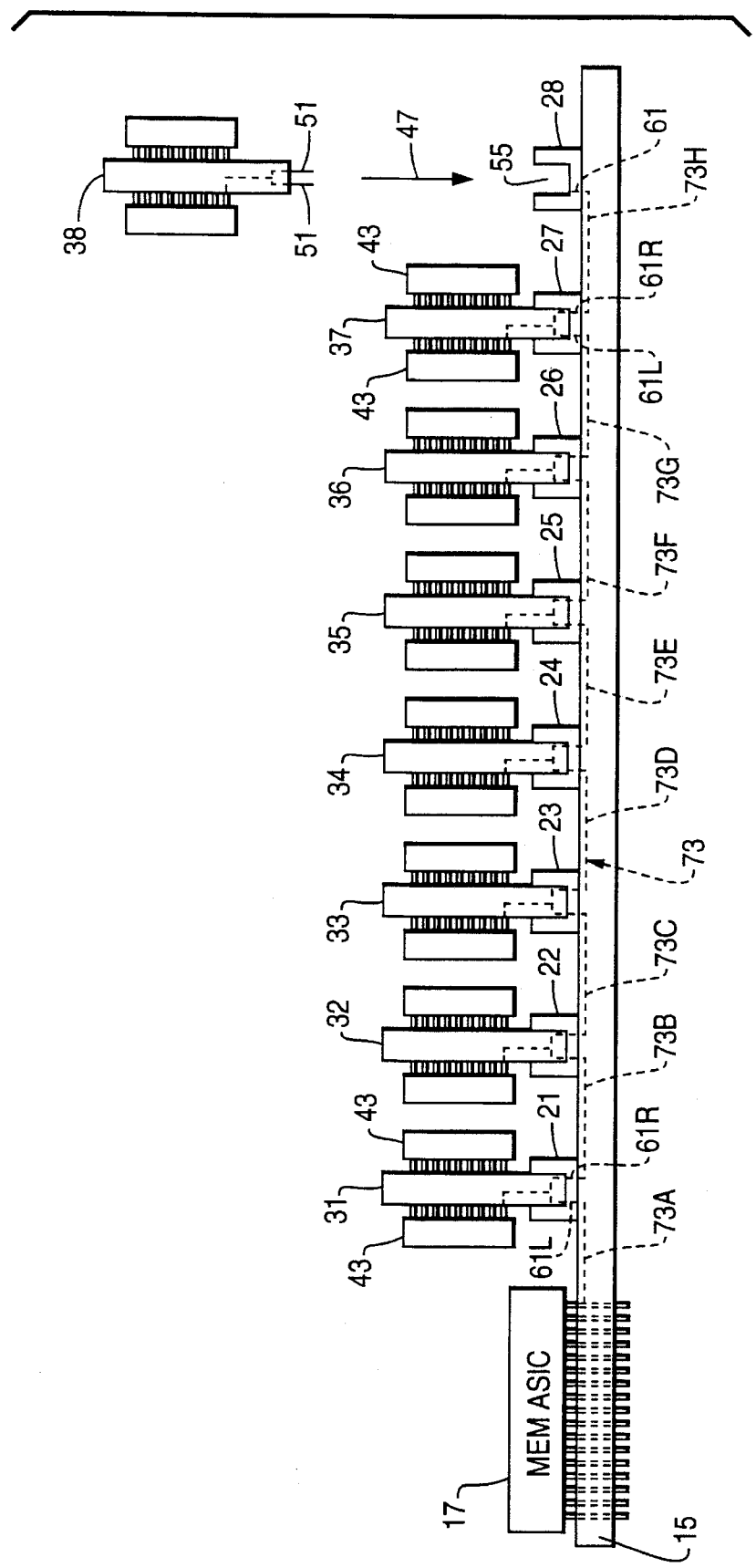

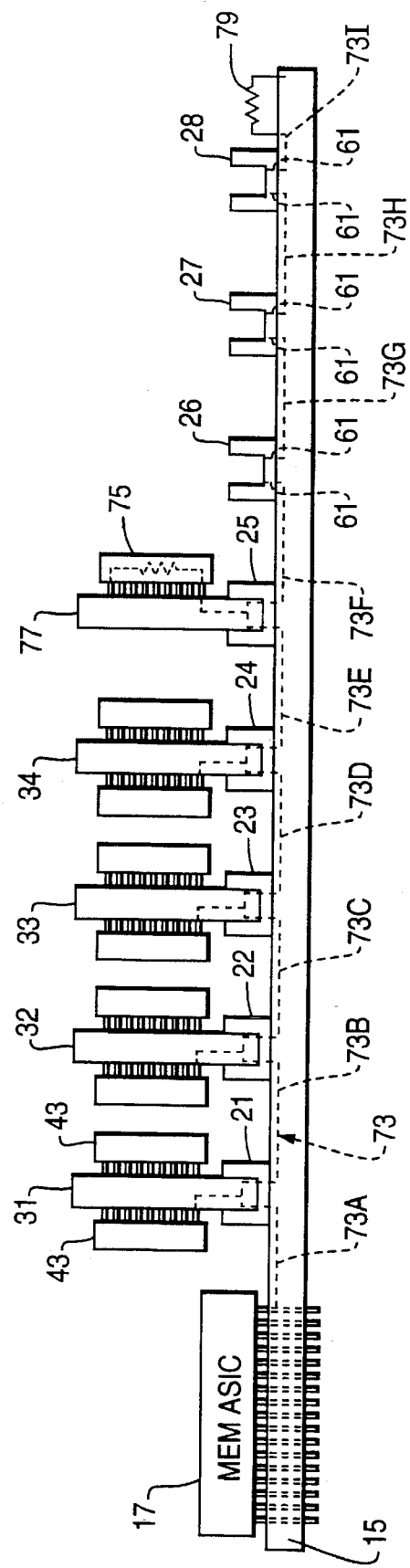

HIGH SPEED MEMORY PACKAGING SCHEME

The present invention relates to memory systems for high speed computer systems and, more particularly, to a circuit board memory module connection system.

BACKGROUND OF THE INVENTION

Present day digital computer systems typically include hundreds of integrated and discrete components mounted on one or more printed circuit boards (PCBs), the components located on a single printed circuit board being interconnected by wiring or circuits within the printed circuit board. These printed circuit boards may also include sockets and connectors for receiving additional components, signal cables, component modules, multi-chip modules and for connection to other printed circuit boards.

Computer memory, specifically RAM (Random Access Memory), often consists of one or more memory modules, such as SIMM (Single In-line Memory Module) boards which plug into special sockets on a main printed circuit board known as a motherboard, or a separate memory board. Each memory module may contain one, four or more megabytes of memory. Several memory module sockets are typically provided, not all of which are necessarily occupied. Thus the user can configure the memory system in accordance with the requirements of the computer system, and add additional memory modules, or larger capacity modules, should the memory demands of the system increase.

The printed circuit board memory module connector sockets are interconnected by a common set of address, data and control lines within the printed circuit board. However, as computer system speeds and memory requirements increase and more and more integrated devices are incorporated into printed circuit boards, computer main memory capacity and complexity have increased. Traditional memory packaging schemes are becoming inadequate as the disparity between on-chip memory speed and inter-chip communication speed increases. Additionally, as the speed of memory operations approaches 100 Mhz, an improved printed circuit board design is required to prevent undesirable transmission line effects.

OBJECTS OF THE INVENTION

It is therefore an object of the present invention to provide a new and useful memory system for use in high speed computer systems.

It is another object of the present invention to provide such a memory system which eliminates undesirable transmission line effects from occurring within printed circuit board conductors connecting memory modules.

It is yet another object of the present invention to provide a new and useful main memory printed circuit board designed to prevent undesirable transmission line effects by automatically sizing memory board transmission line lengths to accommodate memory capacity.

It is still a further object of the present invention to provide new and useful main memory printed circuit board connector design and cooperating memory module design which automatically sizes memory board transmission line lengths to accommodate the number of memory modules installed into memory board connectors.

SUMMARY OF THE INVENTION

There is provided, in accordance with the present invention, a computer memory system comprising a plurality of connectors mounted on a printed circuit board and interconnected by a plurality of transmission lines formed in the printed circuit board. Each of the transmission lines sequentially connects respective points on the plurality of connectors, the plurality of connectors being connected in the same sequence by each of the transmission lines. Each connector is designed to receive memory modules, such as SIMM modules, and provide electrical connection between the plurality of transmission lines and memory logic within a memory module coupled with the connector. Each connector further provides an open circuit in each of the transmission lines in the absence of a memory module coupled with the connector.

In the described embodiment, the connectors each comprise an electrical edge connector including a plurality of signal contacts arranged in pairs forming two rows, the first row being comprised of a first member from each of said pairs and the second row being comprised of a second member from each of said pairs. Each transmission line comprises a plurality of line segments connected between the connectors, each segment providing electrical connection between a first member of a pair of signal contacts associated with a first connector and a second member of a pair of signal contacts associated with a second connector. The cooperating memory modules each include an edge having a plurality of surface contacts which are located along and adjacent to the edge on opposite sides of said memory module. During coupling with a connector, the module edge is placed between the first and second rows of the connector's signal contacts thereby establishing an electrical path between the members of each signal contact pair.

Memory modules are installed into the connectors in the same sequence in which the connectors are connected along the transmission lines In one embodiment of the present invention, a termination module including termination resistors corresponding to the plurality of transmission lines is also provided for installation into the connector immediately following the connectors in which memory modules are installed.

The above and other objects, features, and advantages of the present invention will become apparent from the following description and the attached drawings.

BRIEF DESCRIPTION OF THE DRAWINGS

FIG. 1 is an isometric view of a printed circuit board including a plurality of memory module connectors and cooperating memory modules.

FIG. 2 is a section view of the printed circuit board of FIG. 1 showing the transmission line structure of the memory module connection system, in accordance with a first embodiment of the present invention.

FIG. 3 is a section view of an alternative embodiment of the memory module connection system of the present invention.

DETAILED DESCRIPTION OF THE PREFERRED EMBODIMENT

Referring now to FIG. 1, there is seen an isometric view of a memory packaging scheme for a high speed computer system. The memory packaging scheme includes a plurality of memory module sockets or connectors 21 through 28 mounted upon a printed circuit board 15, such as the computer system's motherboard or a separate memory board. The printed circuit board memory module connectors 21 through 28 and memory control logic 17 are interconnected by a common set of address, data and control transmission lines, not shown in FIG. 1, integrated within printed circuit board 15. In FIG. 2, each memory module connector 21 through 28 includes a channel 55 for receiving a plug-in memory module, discussed below, and a plurality of signal contacts 61 disposed on the sides of channel 55. The signal contacts are electrically connected to the transmission lines embedded within printed circuit board 15.

One or more memory modules, identified by reference numerals 31 through 38, are inserted into the channels of their respective cooperating memory module connectors to fulfill the memory requirements of the computer system. The memory modules shown each include several memory chips 43 mounted to each side of a narrow printed circuit board. On each side of the lower edge of each memory module, a plurality of edge contacts 51 are provided. Upon insertion of the lower edge of a memory module into a memory module connector, each one of the inserted module's edge contacts 51 physically contacts a signal contact 61 of the cooperating connector to establish an electrical connection between a printed circuit board transmission line and the logic included on the memory module.

The structure and operation of the memory system, memory modules and module connectors as described in the preceding paragraphs is known by those skilled in the art and no further explanation will be provided. The distinctions between the prior art memory systems and the memory system constructed in accordance with the present invention will now be discussed with reference to FIGS. 2 and 3.

FIG. 2 is a section view of the printed circuit board of FIG. 1 showing the transmission line structure of the memory module connection system. A single, representative, transmission line 73 consisting of line segments 73A through 73H is shown. Each one of memory module connectors 21 through 27 includes a plurality of pairs of signal contacts 61, the members of each pair being disposed along opposing walls of the connector channel 55. The members of a pair of signal connectors are electrically separate from each other.

Transmission line segment 73A is seen to connect a pin from memory logic ASIC 17 to one signal contact, identified by reference numeral 61L, in memory module connector 21. The signal contact paired with contact 61L in memory module connector 21, identified by reference numeral 61R, is connected by transmission line segment 73B to a signal contact in connector 22. Transmission line segments 73C through 73H provide connections between signal contacts in connectors 22 and 23, 23 and 24, 24 and 25, 25 and 26, 26 and 27, and 27 and 28, respectively.

Edge contacts 51, located along each side of the lower edge of each memory module 31 through 38, are electrically connected together in pairs, each pair consisting of an edge contact on each side of the module edge. The two contacts within each pair are electrically connected by a through-hole via. With the memory module inserted into its cooperating memory module connector, each edge contact pair electrically contects both members of a pair of signal contacts 61. For example, when module 31 is installed into connector 21, signal contacts 61L and 61R are electrically connected through a pair of edge contacts on module 31. Transmission line segments 73A and 73B are thereby connected. The successive installation of additional modules into connectors 22 through 27, appends additional transmission line segments onto segment 73B. The length of transmission line 73 is determined by the number of memory modules installed into connectors 21 through 27. The maximum length of the transmission line is obtained when memory modules are installed into each of connectors 21 through 28, joining in series all of transmission line segments 73A through 73H. With memory modules 31 through 38 removed from their cooperating connectors, transmission line segments 73A through 73H are electrically disconnected from each other.

As stated above, the transmission line 73 consisting of segments 73A through 73H is representative of the plurality of address, data and control lines interconnecting memory module connectors 21 through 28.

FIG. 2 illustrates a low voltage transistor-transistor logic (TTL) implementation of the present invention. A high speed gunning transistor logic (GTL) implementation of the memory system of the present invention, requiring the attachment of a termination resistor at the conclusion of transmission line 73, is shown in FIG. 3. The GTL memory system implementation requires the installation of a terminator resistor module 77 into the memory module socket immediately following the last module socket occupied with a memory module. Terminator module 77 comprises a plurality of termination resistors, a resistor corresponding to each transmission line which requires a termination resistor to match the characteristic impedance of the motherboard and the memory strip transmission lines.

In FIG. 3, four memory modules, identified by reference numerals 31 through 34, are installed into corresponding sockets 21 through 24. Termination module 77 is installed into socket 25. A plurality of discrete resistors are installed into printed circuit board 15, each connected via a transmission line segment to signal connectors in module socket 28, so that memory modules may be installed into all of the module sockets 21 through 28. Discrete resistor 79 is shown connected to transmission line 73 via transmission line segment 73I. Additional discrete resistors, not shown, are provided for transmission lines which require a termination resistors.

It can thus be seen that there has been provided by the present invention a computer system main memory printed circuit board connector design and cooperating memory module design which automatically sizes memory board transmission line lengths to accommodate the number of memory modules installed into memory board connectors and thereby eliminate undesirable transmission line effects from occurring within the printed circuit board transmission lines connecting the memory modules.

Although the presently preferred embodiment of the invention has been described, it will be understood that various changes may be made within the scope of the appended claims.

What is claimed is:

1. A computer memory system, comprising:

a circuit board;

a plurality of connectors mounted to said circuit board;

a common set of transmission lines within said circuit board for the transmission of address, data and control signals to and from said plurality of connectors, each of said transmission lines sequentially connecting respective points on said plurality of connectors, whereby said plurality of connectors are connected in the same sequence by each of said transmission lines; and a plurality of memory modules for coupling with said plurality of connectors;

each one of said connectors providing electrical connection between said plurality of transmission lines and memory logic within a memory module coupled with said connector, and providing an open circuit in each of said transmission lines in the absence of a memory module coupled with said connector;

whereby each one of said transmission lines has a connected length determined by the number of memory modules installed within consecutive connectors, eliminating undesirable transmission line effects resulting from greater transmission line lengths.

2. The computer memory system according to claim 1, wherein:

each one of said connectors comprises an electrical edge connector including a plurality of signal contacts arranged in pairs forming two rows, a first row being comprised of a first member from each of said pairs and a second row comprised of a second member from each of said pairs, and each one of said transmission lines comprises a plurality of transmission line segments connected between said connectors, each segment providing electrical connection between a first member of a pair of signal contacts associated with a first one of said connectors and a second member of a pair of signal contacts associated with a second one of said connectors.

3. The computer memory system according to claim 2, wherein:

each one of said memory modules includes an edge having a plurality of surface contacts located along and adjacent to said edge on opposite sides of said memory module, said edge being placed between said first and second rows of signal contacts when said memory modules is coupled with one of said connectors, each one of said plurality of surface contacts engaging in electrical contact with one of said pairs of signal contacts.

4. The computer memory system according to claim 1, wherein:

said memory modules are installed within said connectors in the same sequence in which said connectors are connected along said transmission lines.

5. The computer memory system according to claim 1, further comprising:

a termination module including a plurality of termination resistors corresponding to said plurality of transmission lines, said termination module for coupling with one of said plurality of connectors, said one of said connectors providing electrical connection between said plurality of termination resistors and their corresponding transmission lines when said termination module is coupled with said one of said connectors.

6. The computer memory system according to claim 5, wherein:

said memory modules are installed within said connectors in the same sequence in which said connectors are connected along said transmission lines.

7. The computer memory system according to claim 6, wherein:

the number of memory modules installed within connectors is less than the number of connectors; and said termination module is installed within a connector immediately following the connectors in which memory modules are installed.

8. The computer memory system according to claim 1, further comprising:

a second plurality of termination resistors corresponding to said plurality of transmission lines, each one of said second plurality of termination resistors being connected to its corresponding transmission line in sequence following said plurality of connectors.

9. The computer memory system according to claim 1, wherein:

said memory modules comprise SIMM modules.

10. A computer memory system for receiving one or more memory modules, comprising:

a circuit board;

a plurality of connectors mounted to said circuit board;

a common set of transmission lines within said circuit board for the transmission of address, data and control signals to and from said plurality of connectors, each of said transmission lines sequentially connecting respective points on said plurality of connectors, whereby said plurality of connectors are connected in the same sequence by each of said transmission lines;

each one of said connectors for receiving one of said memory modules and providing electrical connection between said plurality of transmission lines and memory logic within said memory module coupled with said connector; and each one of said connectors providing an open circuit in each of said transmission lines in the absence of a memory module coupled with said connector, and including means for closing the open circuits for each one of said transmission lines at said connector when one of said memory modules is coupled with said connector;

whereby each one of said transmission lines has a connected length determined by the number of memory modules installed within consecutive connectors, eliminating undesirable transmission line effects resulting from greater transmission line lengths.

11. A computer memory system for receiving one or more memory modules, comprising a circuit board;

a plurality of connectors mounted to said circuit board;

a common set of transmission lines within said circuit board for the transmission of address, data and control signals to and from said plurality of connectors, each of said transmission lines sequentially connecting respective points on said plurality of connectors, whereby said plurality of connectors are connected in the same sequence by each of said transmission lines;

each one of said connectors for receiving one of said memory modules and providing electrical connection between said plurality of transmission lines and memory logic within said memory module coupled with said connector;

each one of said connectors providing an open circuit in each of said transmission lines in the absence of a memory module coupled with said connector, and including means for closing the open circuits for each one of said transmission lines at said connector when one of said memory modules is coupled with said connector; and a termination module including a plurality of termination resistors corresponding to said plurality of transmission lines, said termination module for coupling with one of said plurality of connectors and providing electrical connection between said plurality of termination resistors and their corresponding transmission lines when said termination module and connector are coupled; and wherein said memory modules are installed within said connectors in the same sequence in which said connectors are connected along said transmission lines and said termination module is installed within a connector immediately following the connectors in which memory modules are installed;

whereby each one of said transmission lines has a connected length determined by the number of memory modules installed within consecutive connectors, eliminating undesirable transmission line effects resulting from greater transmission line lengths.

* * * * *